United States Patent [19]

Iwata et al.

[11] Patent Number: 4,524,333
[45] Date of Patent: Jun. 18, 1985

[54] PHASE-LOCKED LOOP USING INTEGRATED SWITCHED FILTER

[75] Inventors: Atsushi Iwata; Takao Kaneko, both of Tokorozawa; Akihiko Ito, Kawasaki; Tadahiro Saito, Kawasaki; Hirokazu Fukui, Kawasaki, all of Japan

[73] Assignees: Nippon Telegraph & Telephone Public Corporation, Tokyo; Fujitsu Limited, Kawasaki, both of Japan

[21] Appl. No.: 407,150

[22] Filed: Aug. 11, 1982

[30] Foreign Application Priority Data

Aug. 12, 1981 [JP] Japan .................. 56-126248

[51] Int. Cl.³ .............................................. H03L 7/08
[52] U.S. Cl. ........................................ 331/17; 331/8; 331/25; 328/155
[58] Field of Search ............... 331/8, 17, 25; 328/155

[56] References Cited

U.S. PATENT DOCUMENTS 4,163,951  8/1979  Aihara et al. ............... 331/17 X
4,208,635  6/1980  Fazakerly et al. .......... 328/155 X
4,371,975  2/1983  Dugan ......................... 328/155 X

OTHER PUBLICATIONS

IEEE Journal of Solid-State Circuits, vol. SC-16, No. 4, Aug. 1981, pp. 315-321, New York, A. Iwata et al.; "A Single-Chip Codec with Switched-Capacitor Filters", p. 318, right-hand column, line 18, p. 319, left-hand column, line 24; Figs. 7, 8.
IEEE Transactions on Acoustics, Speed & Signal Processing, vol. ASSP-29, No. 3, part III, Jun. 1981, pp. 736-744, New York, K. Martin et al., "Switched-Capacitor Building Blocks for Adaptive Systems", p. 736, right-hand column, line 23-p. 738, left-hand column, line 16, Figs. 1, 3.
European Search Report, Examiner I. E. E. Dhondt, 17-05-83, The Hague.

*Primary Examiner*—Eugene R. LaRoche
*Assistant Examiner*—Robert J. Pascal
*Attorney, Agent, or Firm*—Staas & Halsey

[57] ABSTRACT

A phase-locked loop circuit provides a phase comparator which receives input signals through a first input terminal, a loop filter which receives a first output and a second output of the phase comparator, and a voltage-controlled oscillator which produces output signals of an oscillation frequency proportional to the first output and the second output of the loop filter. The signals corresponding to the output signals produced by the voltage-controlled oscillator are supplied to a second input terminal of the phase comparator so that the phase of the signals supplied to the first input terminal of the phase comparator is compared with the phase of the signals supplied to the second input terminal. In the present invention, the loop filter comprises a first capacitor connected to the output terminal of the loop filter, second and third capacitors, each having a terminal connected to the output terminal of the loop filter, and a charging circuit for electrically charging the first, second, and third capacitors. The charging circuit is connected in parallel with the second capacitor. A discharging circuit for discharging the first, second, and third capacitors is connected in parallel with the third capacitor.

9 Claims, 10 Drawing Figures

PHASE-LOCKED LOOP USING INTEGRATED SWITCHED FILTER

BACKGROUND OF THE INVENTION

The present invention relates to a phase-locked loop (PLL) circuit. More particularly, it relates to a loop filter which is used in a PLL circuit.

The PLL circuit usually has a phase comparator, a loop filter, and a voltage-controlled oscillator. An output signal of a frequency corresponding to the oscillation frequency of the voltage-controlled oscillator is supplied to the phase of the oscillator comparator to compare the phase with the phase of an input signal.

In the PLL circuit, an active RC filter is conventionally used as the loop filter. Its transfer function F(S) is given by the following equation:

$$F(S) = \frac{S\tau_2 + 1}{S\tau_1}$$

where $\tau_1 = R_1 \cdot C_0$ and $\tau_2 = R_2 \cdot C_0$, $R_1$ and $R_2$ are resistors, and $C_0$ is a capacitor used in the active RC filter.

When the PLL circuit is formed in the form of an integrated circuit and is used for a coder-decoder circuit, the resistance in the integrated circuit should be about one hundred kilohms at the most. Therefore, if $R_1$ is set to be 2.08 kilohms and $R_2$ to be 28.6 kilohms, capacitor $C_0$ must have a capacitance of 10,000 pF. Capacitor $C_0$ in the integrated circuit comprises a polycrystalline silicon first layer that serves as a first electrode, a polycrystalline silicon second layer that serves as a second electrode, and a silicon dioxide ($SiO_2$) layer that is sandwiched therebetween and that serves as a dielectric member. To obtain a capacitance of 10,000 pF, however, capacitor $C_0$ must be 4 to 5 mm in diameter, which diameter is very large in relation to the size of a transistor which measures several tens of microns in diameter, and defeats the purpose of constructing the circuit in the form of an integrated circuit.

SUMMARY OF THE INVENTION

An object of the present invention is to provide a PLL circuit having a loop filter circuit which uses a small capacitor and has characteristics equivalent to those of a conventional filter.

Another object of the present invention is to provide a PLL circuit which can easily be formed as an integrated circuit.

The above-mentioned objects of the present invention can be achieved by a phase-locked loop circuit which includes a phase comparator for generating a first phase difference signal or a second phase difference signal in response to a phase difference between a first input signal and a second input signal, a loop filter for generating a control voltage corresponding to the phase difference, a voltage controlled oscillator controlled by the control voltage, and feedback means connected between the voltage controlled oscillator and the phase comparator. The loop filter comprises: a first input terminal for receiving the first phase difference signal; a second input terminal for receiving the second phase difference signal; an output terminal for outputting the control voltage; first, second and third capacitors, each having a pair of terminals one of which is connected to the output terminal; means for charging the first capacitor during a period in which the first phase difference signal is generated and discharging the first capacitor during a period in which the second phase difference signal is generated; a first switching means connected to the other terminal of the second capacitor for supplying a first pulse signal when the first pulse difference signal is generated; and second switching means connected to the other terminal of the third capacitor for supplying a second pulse signal when the second phase difference signal is generated.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1:
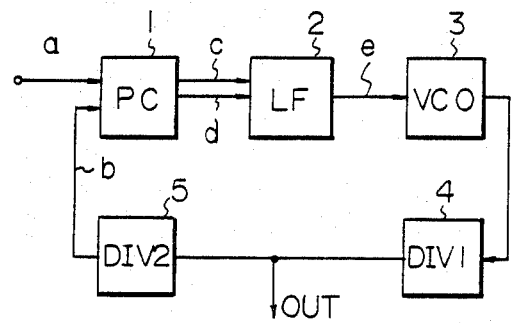
FIG. 1 is a block diagram of an example of a PLL circuit.

A PLL circuit usually has, as shown in FIG. 1, a phase comparator 1, a loop filter 2, and a voltage-controlled oscillator 3 a signal b, having a frequency corresponding to the oscillation frequency of the voltage-controlled oscillator 3, is supplied to the phase comparator to compare the phase of the oscillator with the phase of the input signal a.

In the PLL circuit, furthermore, frequency dividers 4 and 5 are provided in order to divide the frequency (512 KHz) of the signal produced by the voltage-controlled oscillator. The frequency (512 KHz) of the signal is divided by four through frequency divider 4, to obtain a frequency of 128 KHz, and then divided by 16 through frequency divider 5 to obtain signal b having a frequency of 8 KHz, thereby comparing the phase of signal a with the phase of signal b through phase comparator 1. By using a circuit of this construction, signals having a frequency of 128 KHz are stably obtained through output terminal OUT.

When the phase of signal a is in agreement with the phase of signal b, the phase comparator produces outputs c and d, which are both "1". Upon receipt of outputs "1", the loop filter 2 maintains a control voltage e, which is supplied unchanged to voltage-controlled oscillator 3.

When the phase of signal a is in advance of the phase of signal b, signal c becomes "0" and signal d becomes "1". Upon receipt of these signals, loop filter 2 sends control voltage e to voltage-controlled oscillator 3 so that the oscillation frequency increases. Therefore, the oscillation frequency of voltage-controlled oscillator 3 increases so that the phase of signal b is in agreement with the phase of signal a.

When the phase of signal a lags behind the phase of signal b, signal c becomes "1" and signal d becomes "0". Upon receipt of these signals, loop filter 2 sends control voltage e to voltage-controlled oscillator 3 so that the oscillation frequency decreases. Therefore, the oscillation frequency of voltage-controlled oscillator 3 decreases so that the phase of signal b is in agreement with the phase of signal a.

Figure 2A:
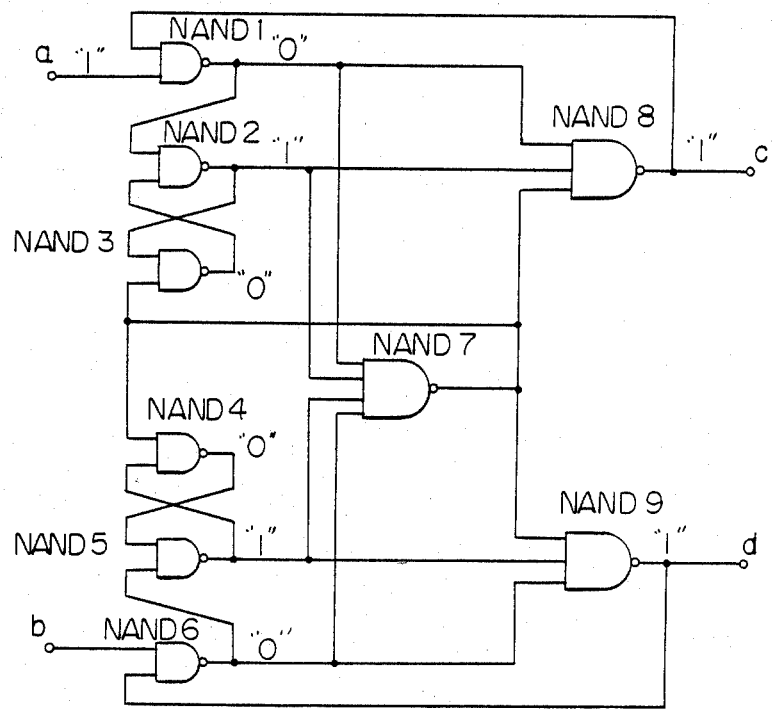
FIG. 2A is a block diagram of a general phase comparator.
Figure 2B:
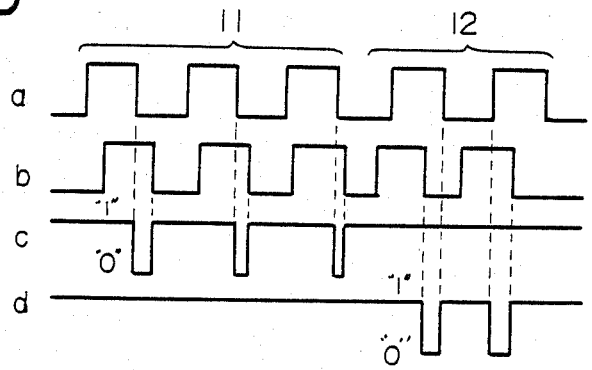
FIG. 2B is a time chart of the waveforms of the input and output of the circuit shown in FIG. 2A.

FIG. 2A is a circuit diagram of the phase comparator circuit 1 which produces signals c and d in response to signals a and b. FIG. 2B is a timing chart. In FIG. 2A, phase comparator 1 comprises NAND gates 1 to 9. NAND gate 1 receives signal a of FIG. 1, NAND gate 6 receives signal b, NAND gate 8 produces signal c, and NAND gate 9 produces signal d.

When the phase of signal a is in advance of the phase of signal b as shown in FIG. 2B, signal c becomes "0" by a width that corresponds to the deviation in phase between signal a and signal b, and signal d maintains the level "1", as indicated by 11.

On the other hand, when the phase of signal a lags behind the phase of signal b, signal d becomes "0" by a width that corresponds to the deviation in phase between signal a and signal b, and signal c maintains the level "1", as indicated by 12.

Figure 3A:
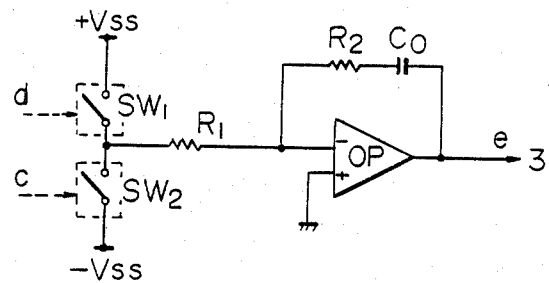
FIG. 3A is a circuit diagram of a conventional loop filter.

Signals c and d produced by the phase comparator in response to the phase deviation between signals a and b are supplied to the loop filter which is shown in FIG. 3A. FIG. 3A is of a conventional loop filter which comprises switches $SW_1$ and $SW_2$ connected in series between power-supply terminals $+V_{SS}$ and $-V_{SS}$, operational amplifier OP in which a first input terminal is connected to the connecting point of the switches through resistor $R_1$, and resistor $R_2$ and capacitor $C_0$ which are connected in series across the input terminal and the output terminal of the operational amplifier and which constitute a feedback loop. A second input terminal of the operational amplifier OP is grounded.

Switches $SW_1$ and $SW_2$ are, respectively, rendered conductive when signals d and c become the level "0" and are rendered nonconductive when signals d and c become the level "1". Therefore, when the phase of signal a is in agreement with the phase of signal b, signals c and d become the level "1" and, hence, switches $SW_1$ and $SW_2$ are both rendered nonconductive so that output voltage e corresponding to the electric charge stored in capacitor $C_0$ is sent to voltage-controlled oscillator 3.

Figure 3B:
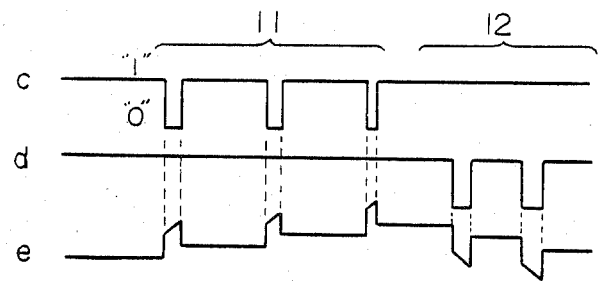
FIG. 3B is a time chart of the waveforms of the input and output of the circuit shown in FIG. 3A.

When the phase of signal a is in advance of the phase of signal b as indicated by 11 in the timing chart of FIG. 3B, signal c, which becomes the level "0", renders switch $SW_2$ conductive so that the electric charge stored in capacitor $C_0$ is discharged to $-V_{SS}$ through resistors $R_1$ and $R_2$.

When operational amplifier OP is in operation, the potential at the first input terminal is equal to the potential at the second input terminal, i.e., equal to zero volts. Therefore, the larger the electric charge stored in capacitor $C_0$, the smaller the output voltage e. When switch $SW_2$ is turned on so that the electric charge stored in capacitor $C_0$ is discharged, output voltage e increases, as shown in FIG. 3B.

When the phase of signal a lags behind the phase of signal b as indicated by 12, on the other hand, signal d, which becomes the level "0", causes switch $SW_1$ to be turned on so that the electrical charge from the power supply $+V_{SS}$ via resistors $R_1$ $R_2$ is stored in capacitor $C_0$. Therefore, contrary to the case of when the electric charge is discharged, output voltage e decreases as shown in FIG. 3B.

Output voltage e is thus supplied to the voltage-controlled oscillator in response to the relation of the phase between signals a and b.

The above-mentioned loop filter, however, has the defects described below. Namely, a loop filter of this type is usually called an active RC filter. Its transfer function F(S) is given by the following equation (1):

$$F(S) = \frac{S\tau_2 + 1}{S\tau} \quad (1)$$

where $\tau_1 = R_1 \cdot C_0$ and $\tau_2 = R_2 \cdot C_0$

If the circuit of FIG. 1 is constructed in the form of an integrated circuit and is employed as a coder/decoder circuit, $\tau_1$ will be set to $2.08 \times 10^{-3}$ seconds, and $\tau_2$ will be set to $2.86 \times 10^{-4}$ seconds.

Generally, the resistance in an integrated circuit should be about several hundred kilohms at the most. Therefore, if $R_1$ is set to be 2.08 kilohms and $R_2$ to be 28.6 kilohms, the capacitor $C_0$ must be 10,000 pF. Capacitor $C_0$ in the integrated circuit comprises a polycrystalline silicon first layer that serves as a first electrode, a polycrystalline silicon second layer that serves as a second electrode, and a silicon dioxide ($SiO_2$) layer that is sandwiched therebetween and serves as a dielectric member. To obtain a capacitance of 10,000 pF, however, capacitor $C_0$ must be 4 to 5 mm in diameter, which diameter is very large in relation to the size of the transistor which measures several tens of microns in diameter, and defeats the purpose of constructing the circuit in the form of an integrated circuit.

Figure 4:
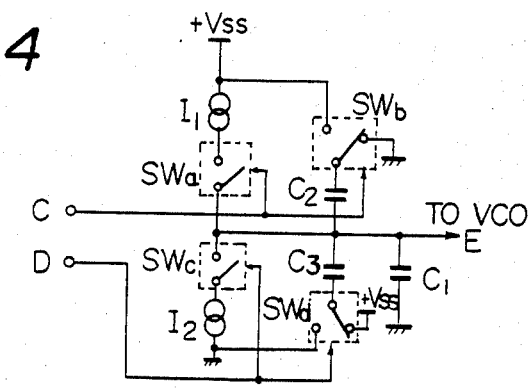
FIG. 4 is a diagram of a loop filter according to the present invention.

FIG. 4 is a block diagram of an embodiment of the present invention. In FIG. 4, capacitor $C_1$ is connected to an output terminal, capacitors $C_2$ and $C_3$ have a terminal connected to the output terminal, and $I_1$ and $I_2$ are constant-current sources. Pairs of switches, $SW_a$ and $SW_b$, and $SW_c$ and $SW_d$, are switched by inputs C and D which correspond to the phase difference. That is, when a signal is received at input terminal C, the pair of switches $SW_a$ and $SW_b$ is actuated so that a predetermined voltage is supplied to another terminal of capacitor $C_2$ and capacitor $C_1$ is charged by constant-current source $I_1$. When a signal is received at input terminal D, the pair of switches $SW_c$ and $SW_d$ is actuated so that the other terminal of capacitor $C_3$ is grounded and capacitor $C_1$ is discharged by constant-current source $I_2$. When no signal is supplied to either of the input terminals C and D, one terminal of capacitor $C_3$ is grounded and the other terminal of capacitor $C_3$ is supplied with a predetermined voltage. In the circuit shown in FIG. 4, capacitor $C_1$, $C_2$, and $C_3$ can be realized as being on the order of several pF to several hundred pF, and the value of $I_1$ and $I_2$ is on the order of several tens of nano-amperes to several tens of micro-amperes. Therefore the circuit shown in FIG. 4 can be formed as an integrated circuit.

Figure 5A:
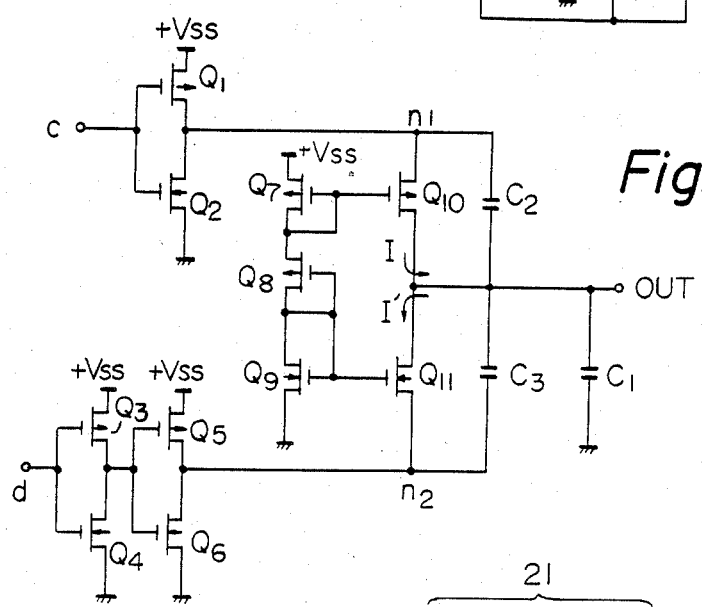
FIG. 5A is a circuit diagram of one embodiment of the loop filter according to the present invention.

FIG. 5A is a diagram which illustrates an embodiment of the present invention in which $Q_1$ to $Q_{11}$ denote transistors and $C_1$, $C_2$, and $C_3$ denote capacitors.

P-channel transistor $Q_1$ and n-channel transistor $Q_2$ constitute a first switch ($SW_a$ in FIG. 4, formed from a first inverter circuit connection) with signal C supplied to the commonly connected gates of transistors $Q_1$ and $Q_2$. Transistors $Q_3$, $Q_4$, $Q_5$, and $Q_6$ constitute a second switch ($SW_c$ in FIG. 4, formed from second and third inverter circuit connections, i.e., $Q_3$ and $Q_4$, and $Q_5$ and $Q_6$ with signal d supplied to the commonly connected gates of transistors $Q_3$ and $Q_4$.

Transistors $Q_7$, $Q_8$, and $Q_9$ are connected in series between power supply $+V_{SS}$ and ground, and the gates of the individual transistors are connected to their drains so that an electric current is allowed to flow from power supply $+V_{SS}$ to ground at all times. The gate of p-channel transistor $Q_{10}$ is connected to the drain of transistor $Q_7$ and the gate of n-channel transistor $Q_{11}$ is connected to the drain of transistor $Q_8$.

The connecting point between transistor $Q_{10}$ and transistor $Q_{11}$ serves as output terminal OUT of the loop filter, and first capacitor $C_1$, second capacitor $C_2$, and third capacitor $C_3$ are connected to the output terminal.

The first and second switches exhibit not only the function of switching transistors $Q_{10}$ and $Q_{11}$ but also the function of driving capacitors $C_2$ and $C_3$.

Operation of the circuit will be described below referring to FIG. 5B.

Figure 5B:
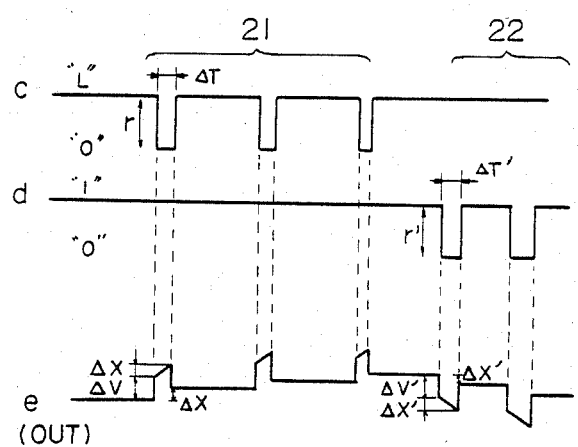
FIG. 5B is a time chart of the waveforms of the input and output of the circuit shown in FIG. 5A.

When the phase of signal a (see FIG. 1) is in advance of the phase of signal b (see FIG. 1) signal d becomes the level "1" signal c is the level "0" as indicated by 21 of FIG. 5B. In response to signal c of the level "0", therefore, p-channel transistor $Q_1$ is rendered conductive and n-channel transistor $Q_2$ nonconductive so that the potential at point $N_1$ becomes a high level.

In this case, the potential at output terminal OUT of the loop filter increases by $\Delta V$ via capacitor $C_2$ as denoted by e in FIG. 5B. If the capacity of each of the capacitors $C_1$, $C_2$, and $C_3$ is denoted by $C_1$, $C_2$, and $C_3$ and if the rising width at point $n_1$ is denoted by V when signal c changes from "1" to "0", increment $\Delta V$ is given by the following equation (2):

$$\Delta V = \frac{C_2}{C_1 + C_2 + C_3} \cdot V \quad (2)$$

At the same time, since the potential at point $n_1$ becomes a high level, the source potential of p-channel transistor $Q_{10}$ becomes greater than the gate potential by more than its threshold value. Therefore, transistor $Q_{10}$ is rendered conductive (at this time, the potential at point $n_2$ becomes a high level and n-channel transistor $Q_{11}$ is rendered nonconductive) and current I is allowed to flow to output terminal OUT via transistor $Q_{10}$ for a period of time corresponding to width $\Delta T$ during which time signal c becomes the level "0". Therefore, the potential at output terminal OUT is further increased by $\Delta X$ in addition to increment $\Delta V$.

Increment $\Delta X$ is given by the following equation (3)

$$\Delta X = \frac{I \cdot \Delta T}{C_1 + C_2 + C_3} \quad (3)$$

As the level of signal c changes from "0" to "1", there is no potential increment $\Delta V$ at output terminal OUT via capacitor $C_2$. Only the potential increment $\Delta X$ is left due to current I that flows through transistor $Q_{10}$ for the period of time $\Delta T$.

Thus, the potential at output terminal OUT increases every time signal c becomes the level "0" until the phase of signal a is in agreement with the phase of signal b. Therefore, the potential at output terminal OUT is supplied to the voltage-controlled oscillator as output voltage e of the loop filter so that the oscillation frequency is increased. Accordingly, the phase of signal b is advanced so that it is in agreement with the phase of signal a. When the phase of signal a (FIG. 1) lags behind the phase of signal b (FIG. 1), signal c becomes the level "1" when the signal d is the level "0" as indicated by 22 of FIG. 5B. In response to signal d of the level "0", p-channel transistor $Q_3$ is rendered conductive, n-channel transistor $Q_4$ is nonconductive, and the potential at the gates of transistors $Q_5$ and $Q_6$ becomes a high level. Consequently, p-channel transistor $Q_5$ is rendered nonconductive, n-channel transistor $Q_6$ is conductive, and the potential at point $n_2$ becomes a low level.

However, the potential as output terminal OUT of the loop filter decreases by $\Delta V'$ via capacitor $C_3$ as denoted by e in FIG. 5B. Like the above-mentioned case, decrement $\Delta V'$ is given by the following equation (4):

$$\Delta V' = \frac{C_3}{C_1 + C_2 + C_3} \cdot V' \quad (4)$$

At the same time, since the potential at point $n_2$ becomes a low level, the source potential of the n-channel transistor becomes smaller than the gate voltage by more than its threshold value. Therefore, transistor $Q_{11}$ is rendered conductive (at this time, the potential at point $n_1$ becomes a low level and p-channel transistor $Q_{10}$ is rendered nonconductive) and current I' (FIG. 5A) is allowed to flow from output terminal OUT to ground via transistors $Q_{11}$ and $Q_6$ for a period of time corresponding to width $\Delta T'$, during which time signal d becomes the level "0". Therefore, the potential at output terminal OUT is further decreased by $\Delta X'$ in addition to decrement $\Delta V'$.

Decrement $\Delta X'$ is given by the following equation (5):

$$\Delta C = \frac{I' \cdot \Delta T}{C_1 + C_2 + C_3} \quad (5)$$

As the level of signal d changes from "0" to "1", there is no potential decrement $\Delta V'$ at output terminal OUT and only potential decrement $\Delta X'$ is left due to the flow of current I' (FIG. 5A) through transistor $Q_{11}$ for the period of time $\Delta T'$.

Thus, the potential at output terminal OUT decreases every time signal d becomes the level "0" until the phase of signal a is in agreement with the phase of signal b. The potential at output terminal OUT is supplied to the voltage-controlled oscillator as output voltage e of the loop filter so that the oscillation frequency decreases. Therefore, the phase signal b is delayed so that it is in agreement with the phase of signal a.

In the above-mentioned embodiment, capacitors $C_2$ and $C_3$ have the same capacitance, and current I is set to be equal to current I'. Further, since the level "1" of signals c and d is equal to $+V_{SS}$ and the level "0" is equal to ground, V is equal to V' and, hence, $\Delta V$ is equal to $\Delta V'$.

According to the circuit of the present invention, as will be obvious from the foregoing description, when the phase of output signal b (inclusive of frequency-divided signals as in the embodiment of the invention) of the voltage-controlled oscillator lags behind the phase of signal a, the potential at output terminal OUT is raised via capacitor $C_2$ and is further raised by capacitor $C_1$ as it is electrically charged through transistor $Q_{10}$ that is rendered conductive at the same time, and, thereby, the oscillation frequency of the voltage-controlled oscillator is increased. When the phase of signal b is in advance of the phase of signal a, the potential at output terminal OUT is lowered via capacitor $C_3$ and is further lowered by capacitor $C_1$ as it discharges the electric charge through transistor $Q_{11}$ that is rendered conductive at the same time, and, thereby, the oscillation frequency of the voltage-controlled oscillator is decreased.

The transfer function F(S) of the loop filter is given by the following equation (6):

$$F(S) = \frac{S\tau_2 + 1}{S\tau_1} \cdot V_{SS} \quad (6)$$

If $\tau_1 = 2.08 \times 10^{-3}$ sec., $\tau_2 = 2.86 \times 10^{-4}$ sec., $V_{SS} = 5$ volts, and $I = 0.06$ μA, the capacitance $C_1$ will be 18.06 pF, and the capacitance $C_2 = C_3$ will be 3.43 pF.

The above capacitances of capacitors $C_1$, $C_2$, and $C_3$ can be realized if combined to occupy an area of 300 μm and can hence be employed in integrated circuits.

Figure 6A:
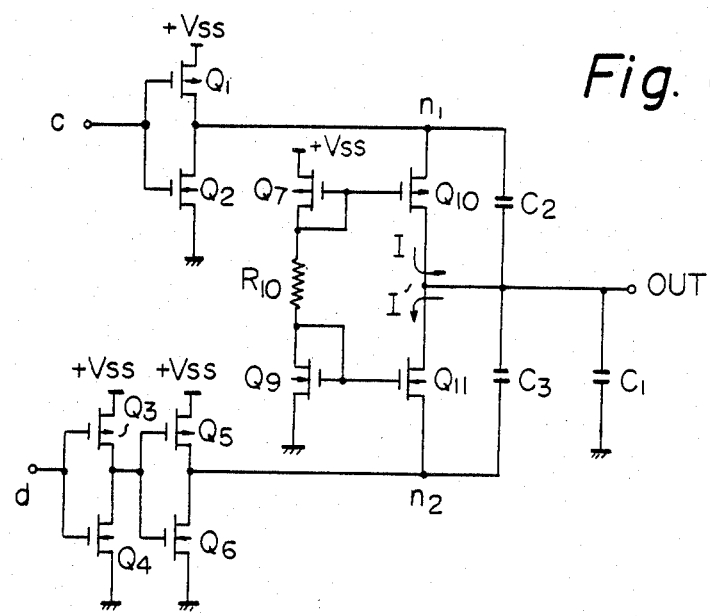
FIG. 6A is a circuit diagram of a second embodiment of the loop filter according to the present invention.
Figure 6B:
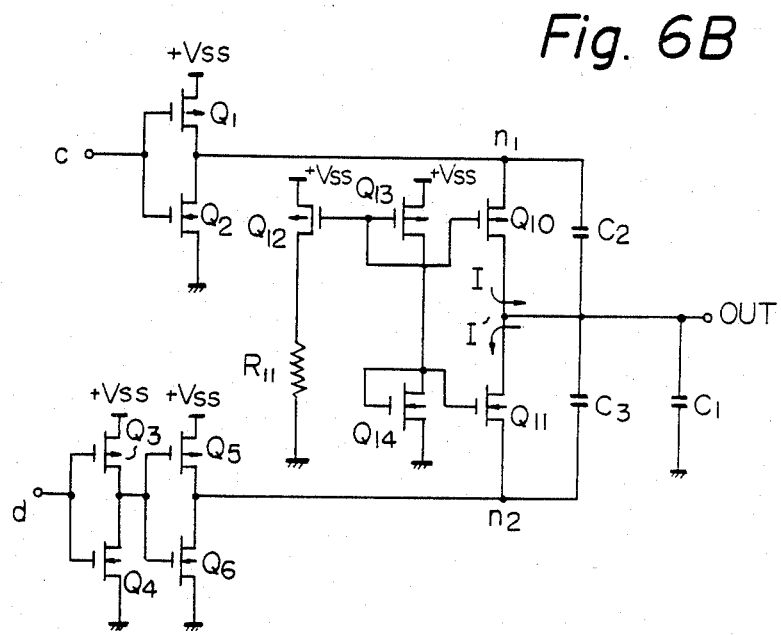
FIG. 6B is a circuit diagram of a third embodiment of the loop filter circuit according to the present invention.

FIGS. 6A and 6B are other embodiments of the present invention. In FIG. 6A, resistor $R_{10}$ is utilized in place of transistor $Q_8$ in FIG. 5A. The temperature dependency of the resistor is less than the transistor, and, therefore, the circuit shown in FIG. 6A can improve the temperature characteristic as compared to the circuit in FIG. 5A. However, the space necessary for the resistor in the integrated circuit is greater than that necessary for the transistor in the integrated circuit. In FIG. 6B, a constant-current source is formed by transistors $Q_{12}$, $Q_{13}$, and $Q_{14}$ and resistor $R_{11}$. In the circuit in FIG. 6B, the voltage is divided by transistor $Q_{12}$ and resistor $R_{11}$, which has less of a temperature dependency, and, therefore, the temperaure characteristic of the constant-current source in circuit 6B can be improved more than the temperature characteristic of the constant-current source in the circuit shown in FIG. 6A.

According to the present invention as mentioned above, the capacitors formed in the loop filter circuit can be sufficiently reduced in size, thereby making it possible to provide a PLL circuit that can be constructed in the form of an integrated circuit.

We claim:

1. A phase-locked loop circuit, operatively connected to receive an input signal and generating a feedback signal, comprising:
   a phase comparator, operatively connected to receive the input signal and the feedback signal, for generating a first phase difference signal or a second phase difference signal in response to a phase difference between the input signal and the feedback signal;
   a loop filter, operatively connected to said phase comparator, for generating a control voltage corresponding to the phase difference;
   a voltage controlled oscillator, operatively connected to said phase comparator, controlled by the control voltage; and
   feedback means, operatively connected between said voltage controlled oscillator and said phase comparator, for providing the feedback signal to said phase comparator, said loop filter comprising:
   a first input terminal, operatively connected to said phase comparator, for receiving the first phase difference signal;
   a second-input terminal, operatively connected to said phase comparator, for receiving the second phase difference signal;
   an output terminal, operatively connected to said voltage controlled oscillator, for outputting the control voltage to control said voltage controlled oscillator;
   first, second and third capacitors, each having a first and a second terminal, each of said second terminals being operatively connected to said output terminal;
   means, operatively connected to said first capacitor, for charging said first capacitor during a time period in which the first phase difference signal is generated and for discharging said first capacitor during a time period in which the second phase difference signal is generated;
   first switching means, operatively connected to said first terminal of said second capacitor and to said means for charging and discharging, for supplying a first pulse signal to said second capacitor when the first phase difference signal is generated by said means for charging and discharging; and
   second switching means, operatively connected to said first terminal of said third capacitor and to said means for charging and discharging, for supplying a second pulse signal to said third capacitor when the second phase difference signal is generated by said means for charging and discharging.

2. A phase-locked loop circuit according to claim 1, wherein said charging and discharging means comprises:
   a first transistor operatively connected to said output terminal and having a gate;
   a second transistor operatively connected to said first transistor and said output terminal, said second transistor having a gate; and
   means, operatively connected to said first and second transistors, for supplying a bias voltage to said gates of said first and second transistors.

3. A phase-locked loop circuit according to claim 2, wherein said first transistor is a p-channel transistor and said second transistor is an n-channel transistor.

4. A phase-locked loop circuit according to claim 2 wherein said bias voltage supplying means comprises:
   a first p-channel transistor having a gate and a drain;
   a second p-channel transistor operatively connected to said first p-channel transistor and having a gate and a drain; and
   an n-channel transistor having a gate and a drain and operatively connected in series with said first p-channel transistor and said second p-channel transistor, each of said gates of said first, second, and n-channel transistors operatively connected to each of said drains, respectively, said gate of said first p-channel transistor operatively connected to said gate of said first transistor, and said gate of said n-channel transistor operatively connected to 5. A phase-locked loop circuit according to claim 2, wherein said bias voltage supplying means comprises:

a p-channel transistor having a gate and a drain and operatively connected to said gate of said first transistor;

an n-channel transistor having a gate and a drain and operatively connected to said gate of said second transistor; and a resistor operatively connected between said drain of said p-channel transistor and said drain of said n-channel transistor, said drains of said n-channel and p-channel transistors operatively connected to each of said gates, respectively.

6. A phase-locked loop circuit according to claim 2 wherein said bias voltage supply means comprises:

a first p-channel transistor having a gate operatively connected to said gate of said first transistor;

an n-channel transistor having a gate and a drain and operatively connected in series with said first p-channel transistor, said gate and drain of said n-channel transistor connected together;

a second p-channel transistor having a gate operatively connected to said gate of said first p-channel transistor; and a resistor operatively connected in series with said second p-channel transistor.

7. A phase-locked loop circuit according to claim 1, wherein said first switching means comprises a first inverter operatively connected between said first input terminal and said first terminal of said second capacitor, and wherein said second switching means comprises a second and third inverter operatively connected in series between said second input terminal and said second terminal of said third capacitor.

8. A loop filter for a phase-locked loop circuit having a phase comparator for providing a first or second phase difference signal to said loop filter and having a voltage controlled oscillator for receiving a control voltage, said loop filter comprising:

a first input terminal, operatively connected to the phase comparator, for receiving the first phase difference signal;

a second input terminal, operatively connected to the phase comparator, for receiving the second phase difference signal;

an output terminal, operatively connected to the voltage controlled oscillator, for outputting the control voltage;

a first capacitor having a first terminal operatively connected to said output terminal and having a second terminal operatively connected to ground;

a second capacitor having a first terminal operatively connected to said output terminal and having a second terminal operatively connected to said first input terminal;

a third capacitor having a first terminal operatively connected to said output terminal and having a second terminal operatively connected to said second input terminal;

means, operatively connected to the phase comparator and said first capacitor, for charging and discharging said first capacitor when the first and second phase difference signals are generated, respectively;

first switching means, operatively connected to the phase comparator and said second terminal of said second capacitor, for supplying a first pulse signal to said output terminal when the first phase difference signal is generated; and second switching means, operatively connected to the phase comparator and said second terminal of said third capacitor, for supplying a second pulse signal to said output terminal when the second phase difference signal is generated.

9. A phase-locked loop circuit according to claim 8, wherein said first switching means comprises a first and second transistor operatively connected in series and operatively connected between said first input terminal and said second terminal of said second capacitor, and wherein said second switching means comprises a third and fourth transistor operatively connected in series and operatively connected to said second input terminal, and a fifth and sixth transistor operatively connected in series and operatively connected to said third and fourth transistors and to said second terminal of said third capacitor.

* * * * *

UNITED STATES PATENT AND TRADEMARK OFFICE
CERTIFICATE OF CORRECTION

PATENT NO. : 4,524,333

DATED : JUNE 18, 1985

INVENTOR(S) : ATSUSHI IWATA ET AL.

It is certified that error appears in the above-identified patent and that said Letters Patent is hereby corrected as shown below:

Col. 1, line 13, delete "of the oscillator";
line 14, after "phase" insert --of the oscillator--.

Col. 2, line 2, delete "a";
line 43, "3a" should be --3. A--.

Col. 4, line 5, "$R_1$ $R_2$" should be --$R_1$ and $R_2$--;
line 50, change "another" to --a--;
line 60, "capacitor" should be --capacitors--.

Col. 5, line 3, "with" should be --and--; and "C" should be --C is--.

Col. 6, line 45, "$\Delta C'$" should be --$\Delta X'$--; and "$\Delta T$" should be --$\Delta T'$--.

UNITED STATES PATENT AND TRADEMARK OFFICE
CERTIFICATE OF CORRECTION

PATENT NO. : 4,524,333
DATED : JUNE 18, 1985
INVENTOR(S) : ATSUSHI IWATA ET AL.

It is certified that error appears in the above-identified patent and that said Letters Patent is hereby corrected as shown below:

Col. 7, after line 20, equation 6, insert the following:

--where $$\tau_1 = \frac{C_1 + C_2 + C_3}{I} \cdot V_{SS} \quad \text{and} \quad \tau_2 = \frac{C_2 \cdot V_{SS}}{I} \text{--};$$

line 27, "μm" should be --μm☐--.

Col. 8, line 66, after "to" insert --said gate of said second transistor.--.

Signed and Sealed this

Twelfth Day of November 1985

[SEAL]

Attest:

DONALD J. QUIGG

Attesting Officer

Commissioner of Patents and Trademarks